United States Patent [19]

Tomita

[11] Patent Number: 5,351,254

[45] Date of Patent: Sep. 27, 1994

[54] SEMICONDUCTOR LASER

[75] Inventor: Akihisa Tomita, Tokyo, Japan

[73] Assignee: NEC Corporation, Tokyo, Japan

[21] Appl. No.: 982,966

[22] Filed: Nov. 30, 1992

[30] Foreign Application Priority Data

Nov. 28, 1991 [JP] Japan .................................. 3-339665

[51] Int. Cl.$^5$ ............................................... H01S 3/19
[52] U.S. Cl. ......................................................... 372/45
[58] Field of Search .............................. 372/43, 44, 45

[56] References Cited

U.S. PATENT DOCUMENTS 5,008,717 4/1991 Bar-Joseph et al. .................... 372/45
5,023,198 6/1991 Strege .................................... 437/129

OTHER PUBLICATIONS

Kazuhisa Uomi et al., "Modulation-Doped Multi--Quantum Well (MD-MQW) Lasers.", Japanese Journal of Applied Physics, vol. 29, No. 1, Jan., 1990, pp. 88-94.
K. Uomi et al., "Ultrahigh relaxation oscillation . . . GaAs/GaAlAs multiple quantum well lasers", Appl. Phys. Lett., 51 (2), 13 Jul. 1987, pp. 78-80.

Primary Examiner—Frank Gonzalez
Attorney, Agent, or Firm—Sughrue, Mion, Zinn, Macpeak & Seas

[57] ABSTRACT

In order to provide a semiconductor laser with high differential gain and low nonlinear gain parameter and is capable of modulation at high speed, a p-type impurity is doped in a multi-quantum well barrier layer 151 which forms an active layer 15, and a spacer layer 152 undoped with impurity and thickness in the range of 2 to 4 nm is inserted between the barrier layer and a well layer 153. By setting the thickness of the spacer layer 152 in the above-mentioned range, the wave function of the electron leaks to the barrier layer 151 beyond the spacer layer 152, whereas the wave function of the hole is localized in the well layer 153 and does not leak to the barrier layer 151. Therefore, electrons alone are scattered and their intraband relaxation time is reduced. Since the intra-band relaxation time of the hole does not change, the nonlinear gain parameter alone is reduced while maintaining the differential gain at a high value, and the maximum modulation frequency can be increased.

9 Claims, 2 Drawing Sheets

SEMICONDUCTOR LASER

BACKGROUND OF THE INVENTION

The present invention relates to a semiconductor laser, and more particularly to a semiconductor laser which can be modulated at ultrahigh speed used in optical communication or the like.

In recent years, demands for large capacity optical communication is becoming increasingly high. For this reason, a modulation speed higher than several tens of gigabits per second is demanded for semiconductor lasers which serve as the light sources. As a method for enhancing the response speed of the semiconductor laser there has been proposed to employ a quantum well structure or a strained quantum well structure having a high differential gain as an active layer. In fact, it is reported by Uomi et al. in Applied Physics Letters, Vol. 45, p. 818 (1984) that they succeeded in obtaining a relaxation oscillation frequency of over 10 GHz in a semiconductor laser using the GaAs/AlGaAs quantum well structure. Furthermore, it is reported in Applied Physics Letters, Vol. 51, p. 78 (1987) that the differential gain can be improved by accumulating holes in advance in a well layer by the use of a selectively p-doped structure for a multi-quantum well which becomes an active layer.

The response speed of a semiconductor laser is also be affected by the nonlinear gain. In order to improve the response speed it is necessary to reduce the nonlinear gain. Since reduction of the relaxation time within a band leads not only to a reduction in the nonlinear gain but also to a decrease in the differential gain at the same time, it will not act advantageously for the purpose of increasing the response speed.

SUMMARY OF THE INVENTION

It is the object of this invention to provide a semiconductor laser capable of high-speed modulation which employs a quantum well with high differential gain and low nonlinear gain as an active layer.

A first semiconductor laser of this invention for settling the above-mentioned technical issue is characterized in that it employs a multi-quantum well consisting of a barrier layer containing a p-type impurity at a concentration higher than $10^{18}$ cm$^{-3}$, an undoped spacer layer with thickness in the range of 2 to 4 nm, and an undoped well layer, as an active layer, the well layer is placed between a pair of the spacer layers, and a semiconductor layer structure formed by placing the well layer between the spacer layers is placed in turn between a pair of barrier layers.

A second semiconductor layer according to this invention is characterized in that it employs a multi-quantum well consisting of a first undoped barrier layer, a second barrier layer with forbidden band with smaller than that of the first barrier layer and contains a p-type impurity at a concentration higher than $10^{18}$ cm$^{-3}$, an undoped spacer layer with thickness of 2 to 4 nm and has a forbidden band width equal to that of the second barrier layer, and an undoped well layer, as an active layer, the well layer is placed between the spacer layers, the semiconductor laminated structure A formed by placing the well layer between the spacer layers is placed between the second barrier layers, and the semiconductor laminated structure B formed by placing the semiconductor laminated structure A between the second barrier layers is placed in turn between the first barrier layers.

DESCRIPTION OF THE PREFERRED EMBODIMENTS

Figure 1:
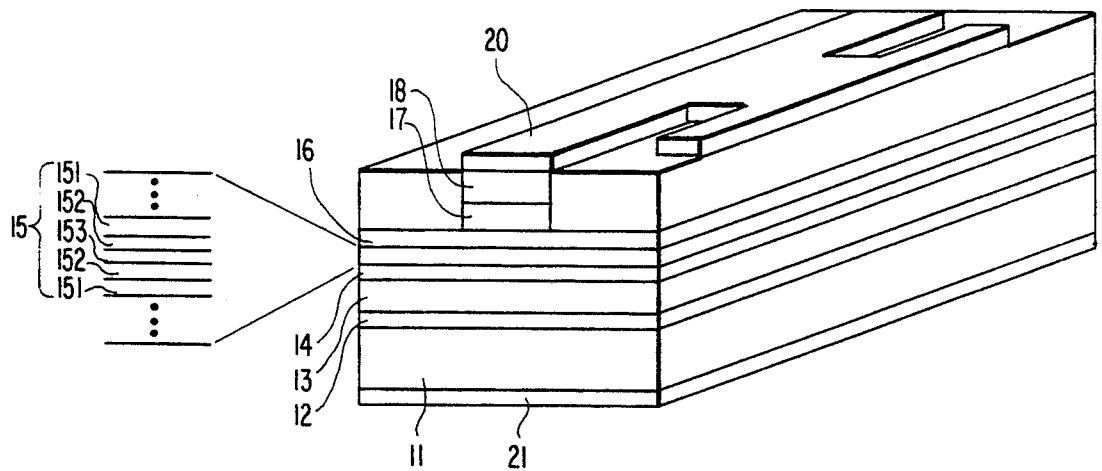
FIG. 1 is a perspective view showing the structure of a semiconductor laser formed by a first embodiment of this invention.

Referring to FIG. 1, a first embodiment of this invention will be described in the following. On an n-type InP substrate 11 there are grown in sequence a 100 nm-thick n-type InP buffer layer 12, a 15 $\mu$m-thick n-clad layer 13 consisting of n-type InP, and a 200 nm-thick lower guide layer 14 consisting of undoped InGaAsP with band gap wavelength 1.15 $\mu$m. Further, an active layer 15 consisting of a multi-quantum well structure formed by repetitive growth for four consecutive times of a four-layer structure obtained by sequential formation of a 7 nm-thick barrier layer 151 consisting of InGaAsP doped with Be to a concentration of $1 \times 10^{18}$ cm$^{-3}$ and has band gap wavelength 1.3 $\mu$n, a 3 nm-thick spacer layer 152 consisting of undoped InGaAsP with band gap wavelength 1.3 $\mu$m, a 7 nm-thick well layer 153 consisting of undoped InGaAs, and a 3 nm-thick spacer layer 152 consisting of undoped InGaAsP with band gap wavelength 1.3 $\mu$m, with 7 nm-thick barrier layer 151 consisting of InGaAsP doped with Be to a concentration of $1 \times 10^{18}$ cm$^{-3}$ and has band gap wavelength 1.3 $\mu$m formed on top of it, a 200 nm-thick upper guide layer 16 consisting of undoped InGaAsP with band gap wavelength 1.15 $\mu$m, a 1.5 $\mu$m-thick p-clad layer 17 consisting of p-type InP, and a 1 $\mu$m-thick contact layer 18 consisting of p+-type InGaAs are grown sequentially. Crystal growth is carried out by a gas source molecular beam epitaxy (MBE). The semiconductor layer is removed leaving a 2 $\mu$m-wide laser stripe in the axial direction of the resonator, and the removed part is filled with polyimide. Further, a p-side electrode 20 is formed, the substrate 11 is ground to the thickness of 100 $\mu$m, and an n-side electrode 21 is formed.

Figure 2:
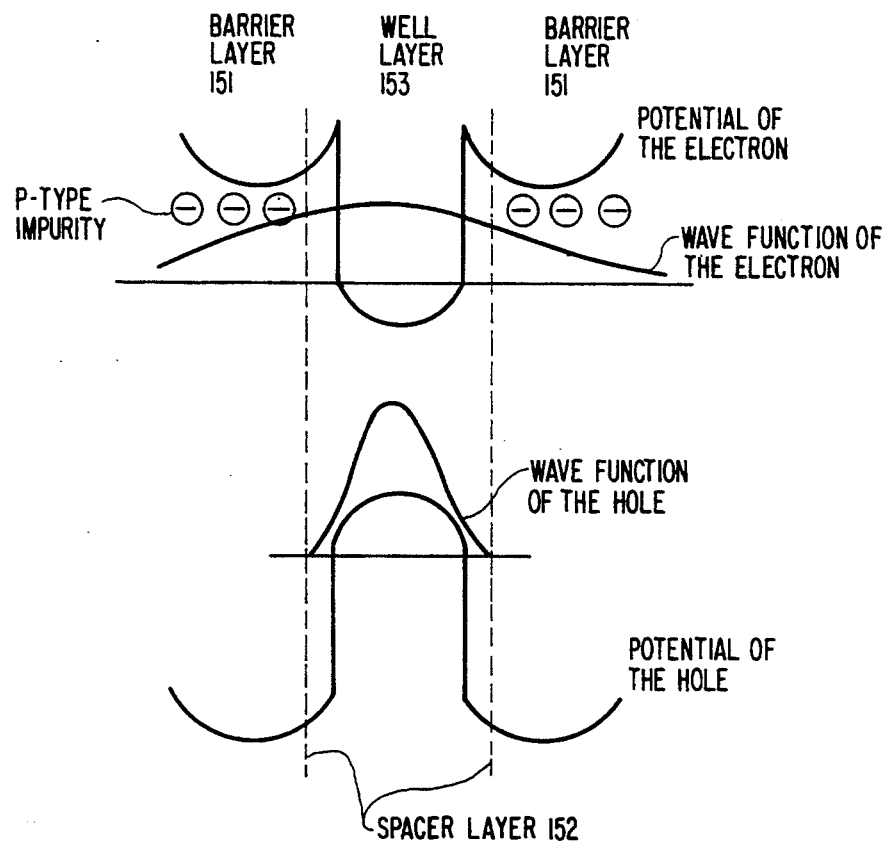
FIG. 2 is an explanatory diagram showing the potential structure of an active layer 15 of the first embodiment.

FIG. 2 is an explanatory diagram showing the potential structure of the active layer 15 of the first embodiment. Electrons alone are scattered by the impurities of the barrier layer 151. Because of this, the intra-band relaxation time of the electron is reduced from 140 fs to 100 fs without change of the intra-band relaxation time of 60 fs for the hole. As a result, the nonlinear gain parameter is reduced from $4 \times 10^{-23}$ m$^3$ to $2.6 \times 10^{-23}$ m$^3$. Since the reduction in the differential gain at this time is about 10%, the maximum modulation frequency is increased by 36% compared with the case of the conventional semiconductor laser that employs a selectively p-doped active layer.

The operation of the invention will be described in more detail below.

The gain g of the semiconductor can be represented as in the following.

$$g(\omega, S) \propto \Sigma_k L(\omega - \omega_k) \frac{f_e - f_h}{1 + \epsilon S},$$

where fe and fh are the electron and hole distribution functions, S is the electric field of the light, $\epsilon$ is the nonlinear gain parameter, and k is the wave number of the electron or the hole.

The differential gain dg/dN is given by $$\frac{dg(\omega, S)}{dN} \propto \Sigma_k L(\omega - \omega_k) \frac{d(f_e - f_h)/dN}{1 + \epsilon S}$$

where N is the career density. In the above, $L(\omega - \omega_k)$ is the spectral line shape function which can be approximated as follows in terms of the in-band relaxation times $\tau e$ and $\tau h$ of the electron and the hole, respectively.

$$L(\omega - \omega_k) = \frac{1/\tau_e + 1/\tau_h}{(\omega - \omega_k)^2 + (1/\tau_e + 1/\tau_h)^2}$$

In addition, the nonlinear gain parameter $\epsilon$ can be written approximately as $$\epsilon = (\mu^2 \omega/n^2 \epsilon_o \zeta) \tau_e \tau_h,$$

where $\mu$ is the dipole moment, $\zeta$ is the Plank's constant, n is the index of refraction of the waveguide, and $\epsilon_o$ is the dielectric constant of the vacuum.

The differential gain is larger for smaller trailing of the bottom of the spectral line shape function, that is, for smaller value of the arithmetic means $\tau' = 1/\tau_e + 1/\tau_h$ of the intra-band relaxation times. On the other hand, the nonlinear gain parameter is the smaller for the smaller value of the product $\tau_e \tau_h$ of the intra-band relaxation times. Since the in-band relaxation time of the hole in the semiconductor is smaller compared with the in-band relaxation time of the electron, $\gamma'$ is approximately determined by $\tau h$-. From this fact, the nonlinear gain parameter can be decreased without affecting the differential gain if it is possible to reduce the intra-band relaxation time of the electron without changing the intra-band relaxation time of the hole.

In this invention the intra-band relaxation time of the electron alone is reduced by the following method. When a p-type impurity is doped in a barrier layer, the impurity is ionized. Since the wave function of the carrier leaks out up to the barrier layer, even though the carrier is confined in the well layer, the carrier is scattered off by the ionized impurity. In the conventional selectively doped structure, an undoped spacer layer with thickness greater than 10 nm is inserted between the layer doped with the impurity and the well layer in order to prevent the scattering. A feature of this invention resides in that the thickness of the spacer layer is set to be in the range of 2 to 4 nm. By reducing the thickness of the spacer layer to less than 4 nm, the wave function of the electron spreads sufficiently to the layer doped with the impurity beyond the spacer layer, as shown in FIG. 2, since the effective mass of the electron is small. On the other hand, the hole has a large effective mass so that its wave function is almost completely localized within the well layer and will not extend beyond the spacer layer. Because of this, the electron is scattered by the impurity but the hole is hardly scattered. In this way, by setting the thickness of the spacer to be in the range of 2 to 4 nm it becomes possible to decrease the in-band relaxation time of the electron alone without changing the in-band relaxation time of the hole. If the thickness of the spacer layer is made less than 2 nm, the wave function of the hole also leaks to the barrier layer and is scattered by the impurity, and the differential gain of the semiconductor laser is decreased.

Figure 3:
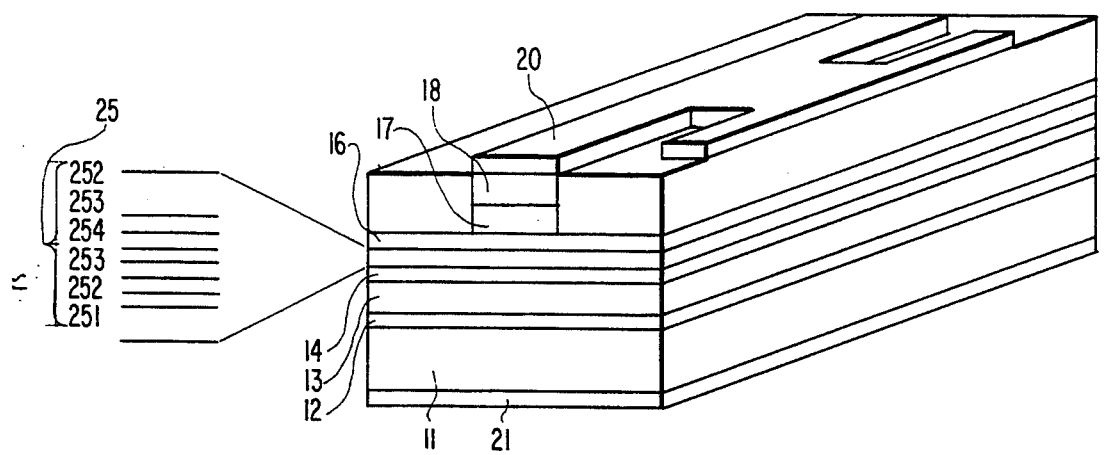
FIG. 3 is a perspective view showing the structure of a semiconductor laser formed by a second embodiment of the invention.
Figure 4:
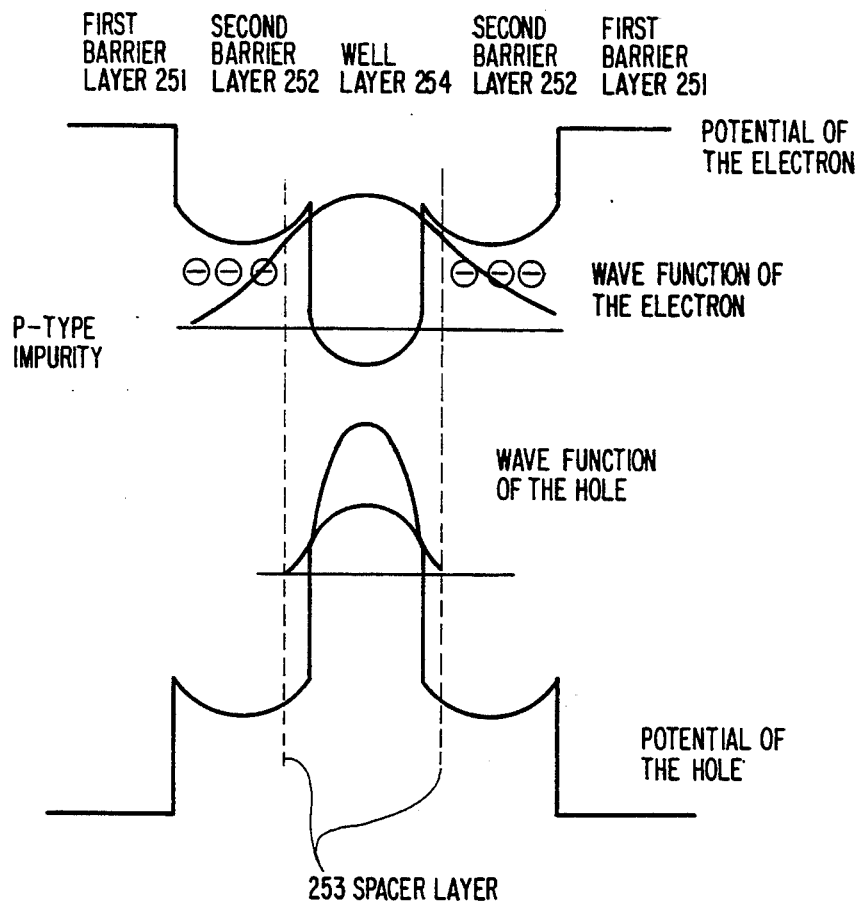
FIG. 4 is an explanatory diagram showing the potential structure of an active layer 25 of the second embodiment.

If the wave function of the electron spreads too far, its overlap with the wave function of the hole is decreased and the gain will be reduced. In order to prevent this it is only necessary to introduce a potential structure which controls the spread. In other words, by doping a p-type impurity in the second barrier layer which has smaller forbidden band width than that of the first barrier layer, it is possible to nearly completely confine the electrons in the second barrier layer. Because of this, the electrons alone will be scattered by the impurities of the second barrier layer without reducing the overlap of the wave functions of the electron and the hole, and it becomes possible to make a high differential gain and a low nonlinear gain parameter at the same time. Referring to FIGS. 3 and 4, examples of the improvement will be described in what follows.

Referring to FIG. 3, an example of the second embodiment will be described. On an n-type InP substrate 11, a 100 nm-thick n-type InP buffer layer 12, a 1.5 $\mu$m-thick n-clad layer 13 consisting of n-type InP, and a 200 nm-thick undoped InGaAsP 14 with band gap wavelength 1.5 $\mu$m are grown sequentially. Further, an active layer 25 consisting of a multi-quantum well structure formed by repetitive growth for four consecutive times of a six-layer structure obtained by sequential formation of a 5 nm-thick first barrier layer 251 consisting of undoped InGaAsP with band gap wavelength 1.24 $\mu$m, a 4 nm-thick second barrier layer 252 consisting of InGaAsP with band gap wavelength 1.3 $\mu$m doped with Be to a concentration of $2 > 10^{18}$ cm$^{-3}$, a 3 nm-thick spacer layer 253 consisting of undoped InGaAsP with band gap wavelength 1.3 $\mu$m, a 7 nm-thick well layer 254 consisting of undoped InGaAsP, a 3 nm-thick spacer layer 253 consisting of undoped InGaAsP with band gap wavelength 1.3 $\mu$m, and a 4 nm-thick second barrier layer 252 with band gap wavelength 1.3 $\mu$m doped with Be to a concentration of $2 \times 10^{18}$ cm$^{-3}$, with a 5 nm-thick first barrier layer 251 consisting of undoped InGaAsP with band gap wavelength 1.24 $\mu$m formed on top of it, a 200 nm-thick upper guide layer 16 consisting of undoped InGaAsP with band gap wavelength 1.15 $\mu$m, a 1.5 $\mu$m-thick p-clad layer 17 consisting of p-type InP, and a 1 $\mu$m-thick contact layer 18 consisting of P+-type InGaAs are sequentially laminated. Crystal growth is carried out by gas source MBE method. The semiconductor layer is removed by leaving a 2 $\mu$m-wide laser stripe in the axial direction of the resonator, and the removed part is filled with polyimide. Further, a p-side electrode 20 is formed, the substrate 11 is ground down to the thickness of 100 $\mu$m, and an n-side electrode 21 is formed.

FIG. 4 is an explanatory diagram showing the potential structure of the active layer 25 of this embodiment. Electrons alone are scattered by the impurities of the second barrier layer 252. Because of this, the in-band relaxation time of the electron alone is reduced from 140 ms to 100 fs without change of the in-band relaxation time of 60 fs of the hole. As a result, the nonlinear gain parameter is reduced from $4 \times 10^{-23}$ m$^3$ to $2.6 \times 10^{-23}$ m$^3$. According to this embodiment the differential gain is increased due to improvement of electron confinement, which cancels the decrease in the differential gain due to reduction of the intra-band relaxation time of the electron. Therefore, this embodiment is capable of increasing the maximum modulation frequency by 40% compared with the conventional semiconductor laser which makes use of the selectively p-doped active layer.

Summarizing the effect of this invention described in detail in the above, it is possible to obtain a semiconductor laser which employs a quantum well having a large differential gain and a small nonlinear gain as an active layer so that high speed modulation is realizable.

What is claimed is:

1. A semiconductor laser comprising:
   a semiconductor body having a top and bottom surfaces, first and second side surfaces extending between said top and bottom surfaces to form a resonant cavity, and third and fourth side surfaces extending between said first and second side surfaces.
   said semiconductor body consisting of a plurality of semiconductor layers including an active layer extending between said first and second side surfaces, said active layer having a multi-quantum well structure comprising:
   a pair of barrier layers;
   a well layer located between said pair of barrier layers; and
   a pair of spacer layers sandwiched between said pair of barrier layers such that said well layer is sandwiched between said a pair of spacer layers, each of said spacer layers having a thickness of 2 and 4 nm; and
   first and second electrodes formed on said top and bottom surfaces, respectively.

2. A semiconductor laser as claimed in claim 1, wherein said well layer and said spacer layers are undoped with impurities and said barrier layers are doped with a p-type impurity at a concentration not less than $10^{18}$ cm$^{-3}$.

3. A semiconductor laser as claimed in claim 2, further comprising a pair of undoped barrier layers having forbidden band width greater than that of said pair of doped barrier layers such that said pair of doped barrier layers are sandwiched between said pair of undoped barrier layers.

4. A semiconductor laser comprising:
   a semiconductor substrate of a first conductivity type;
   a clad layer of said first conductivity type formed on said substrate;
   a guide layer of said first conductivity type formed on said clad layer;
   an active layer formed on said guide layer, said active layer having a first barrier layer doped with an impurity of a second conductivity type opposite to said first conductivity type, a first undoped spacer layer with thickness of 2 to 4 nm formed on said first barrier layer, an undoped well layer formed on said first spacer layer, an undoped second spacer layer formed on said well layer, and a second barrier layer doped with said second conductivity impurity formed on said second spacer layer;
   a second conductivity type guide layer formed on said active layer;
   a second conductivity type clad layer formed on said second conductivity type guide layer;
   a contact layer formed on said second conductivity type clad layer;
   a first electrode formed on a top surface of said contact layer;
   a second electrode formed on a rear surface of said substrate; and
   a pair of opposed end surfaces extending between said top surface and said rear surface to provide a resonant cavity for laser light.

5. A semiconductor laser as claimed in claim 4, further comprising a third and fourth undoped barrier layers having forbidden band width greater than that of said first and second barrier layers such that a five-layer structure of said first barrier layer, first undoped spacer layer, undoped well layer, undoped second spacer layer, and second barrier layer are sandwiched between said third and fourth undoped barrier layers.

6. A semiconductor laser as claimed in claim 5, wherein said barrier layers are doped with a p-type impurity at a concentration not less than $10^{18}$ cm$^{-3}$.

7. A semiconductor laser diode comprising:
   a semiconductor substrate of a first conductivity type;
   a first clad layer of said first conductivity type formed on said substrate;
   a first guide layer of said first conductivity type formed on said clad layer;
   an active layer formed on said guide layer, said active layer having a first undoped barrier layer, a first doped barrier layer formed on said first undoped barrier layer with an impurity of a second conductivity type opposite to said first conductivity type, a first undoped spacer layer with thickness of 2 to 4 nm formed on said first barrier layer, an undoped well layer formed on said first spacer layer, an undoped second spacer layer formed on said well layer, a second doped barrier layer doped with second conductivity impurity formed on said second spacer layer and a second undoped barrier layer formed on said second doped barrier layer;
   a second clad layer of a second conductivity type layer formed on said second guide layer;
   a contact layer formed on said second clad layer;
   a first electrode formed on a top surface of said contact layer;
   a second electrode formed on a rear surface of said substrate; and
   a pair of opposed end surfaces extending between said top surface and said rear surface to provide a resonant cavity for laser light.

8. A semiconductor laser as claimed in claim 7, wherein said first and second doped barrier layers have an impurity concentration of $10^{18}$ cm$^{-3}$ or more.

9. A semiconductor laser as claimed in claim 8, wherein said semiconductor substrate and said first clad layer are each made of an n-type InP, said first guide layer is made of an undoped InGaAsP, said active layer is made of InGaAsP, said second guide layer is made of undoped InGaAsP, said second clad layer is made of p-type InP, and said contact layer is made of p$^+$-type InGaAs.

* * * * *

UNITED STATES PATENT AND TRADEMARK OFFICE
CERTIFICATE OF CORRECTION

PATENT NO. : 5,351,254

DATED : SEPTEMBER 27, 1994

INVENTOR(S) : TOMITA

It is certified that error appears in the above-identified patent and that said Letters Patent is hereby corrected as shown below:

Col. 2, line 32, delete " $\mu$n", insert -- $\mu$m --.

Col. 3, line 19, delete "$\tau$e and $\tau$h" insert -- $\tau_e$ and $\tau_h$ --;

Col. 3, line 35, delete "r", insert -- $\gamma'$ --;

Col. 3, line 41, delete "rh-", insert -- $\tau_h$. --.

Signed and Sealed this

Sixth Day of December, 1994

Attest:

BRUCE LEHMAN

Attesting Officer  Commissioner of Patents and Trademarks